United States Patent [19]

Murao

[11] Patent Number: 4,891,627

[45] Date of Patent: Jan. 2, 1990

[54] DEVICE FOR DETECTING OBJECT

[75] Inventor: Eiji Murao, Saitama, Japan

[73] Assignee: Honda Giken Kogyo Kabushiki Kaisha, Tokyo, Japan

[21] Appl. No.: 349,914

[22] Filed: May 9, 1989

Related U.S. Application Data

[63] Continuation of Ser. No. 129,861, Dec. 4, 1987, abandoned, which is a continuation of Ser. No. 20,238, Feb. 27, 1987, abandoned, which is a continuation of Ser. No. 734,805, May 15, 1986, abandoned.

[30] Foreign Application Priority Data

Nov. 22, 1983 [JP] Japan ................................. 58-220412

[51] Int. Cl.$^4$ .............................................. G08B 13/26
[52] U.S. Cl. ..................................... 340/562; 340/564
[58] Field of Search ............... 340/562, 564, 903, 904, 340/435–437, 565; 200/DIG. 1

[56] References Cited

U.S. PATENT DOCUMENTS

| 2,421,771 | 6/1947 | Browning | 340/564 |
| 4,295,132 | 10/1981 | Burney et al. | 340/562 |
| 4,300,116 | 11/1981 | Stahouee | 340/562 |
| 4,316,180 | 2/1982 | LeVert | 340/562 |
| 4,345,167 | 8/1982 | Caluih | 340/562 |
| 4,366,473 | 12/1982 | Inoue et al. | 340/564 |

Primary Examiner—Donnie L. Crosland
Attorney, Agent, or Firm—Lyon & Lyon

[57] ABSTRACT

A device for detecting an object includes apparatus for converting a variation of a floating capacity between a sensor consisting of an electrode plate and an object to be detected into a variation of a frequency signal and apparatus for detecting the state of approach of the object in accordance with the attenuation of the frequency signal.

4 Claims, 3 Drawing Sheets

DEVICE FOR DETECTING OBJECT

This is a continuaton of co-pending application Ser. No. 129,861, filed on Dec. 4, 1987, now abandoned, which is a continuation of application Ser No. 020,238, filed 2/27/87, now abandoned, which is a continuation of application Ser. No. 734,805, filed 5/15/86, now abandoned.

BACKGROUND OF INVENTION

1. Field of the Invention

The present invention relates to a device for detecting state of approach of an object such as an obstacle.

2. Prior Art

Heretofore, a device for detecting an object which is used, for example, as an obstacle detecting device for detecting an obstacle during running of an automobile comprises a transmitter for transmitting an electromagnetic wave or a ultrasonic wave having directivity and a receiver for receiving the wave which has been reflected from the object, thereby detecting the object, such as obstacle.

Such a convntional device requires the use of the transmitter and the receiver, so that it is complicated in construction. Furthermore it employs a wave having directivity, so that it tends to provide an insensible area at close range.

OBJECT OF THE INVENTION

The present invention aims at eliminating the disadvantages of the conventional device and it is an object of the present invention to provide a device for detecting an approaching object, such as obstacle, in reliable manner, which has a simple construction.

SUMMARY OF INVENTION

It will be understood that the present invention provides a device for detecting an object which comprises a means for converting a variation of a floating capacity between a sensor consisting of an electrode plate and an object to be detected into a variation of a frequency signal and a means for detecting the state of approach of the object, in accordance with the attenuation of the frequency signal. Thus, the device according to the present invention provides a superior advantage in that the state of approach of an object can be detected in reliable manner by the simple construction.

BRIEF DESCRIPTION OF THE DRAWINGS

Now, the invention will be explained with reference to the drawings, in which.

DESCRIPTION OF THE PREFERRED EMBODIMENT

Now a preferred embodiment of the present invention will be explained with reference to the drawings.

Figure 1:
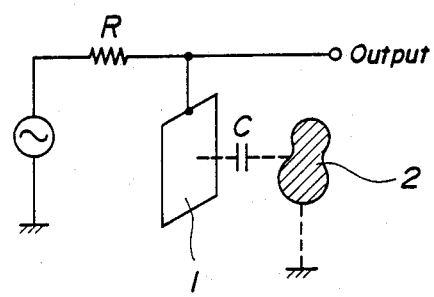
FIG. 1 is a circuit diagram showing the principle of the detection of object according to the present invention.

FIG. 1 is a circuit diagram showing the prnciple of detection of an object according to the present invention. In the circuit as shown in FIG. 1, when a high frequency signal is applied to a series circuit including an electrode plate 1 and a resistor R, the floating capacity C between the electrode plate 1 and the object 2 varies in accordance with the distance therebetween and the high frequency output voltage at the potential dividing point varies accordingly. The present invention takes advantage of this phenomenon and the electrode plate 1 is utilized as a sensor. The state of approach of the object 2 can be detected by detecting the state of lowering of the output voltage which is caused by the approach of the object 2 to said sensor.

Figure 2:
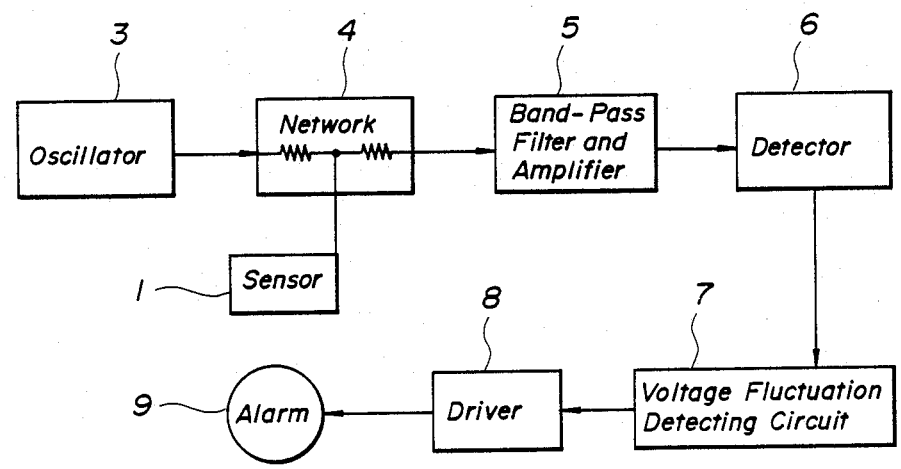
FIG. 2 is a block diagram showing an embodiment of the device according to the present invention.

FIG. 2 illustrates an embodiment of the device for detecting an object which is constructed on the principle of the present invention as explained above. The device as illustrated in FIG. 2 includes an oscillator 3 for generating a fixed frequency signal, a network 4 consisting of a resistance dividing circuit arranged at the output side of said oscillator 3, a sensor 1 consisting of an electrode plate connected to the dividing point of said network 4, a band-pass filter and amplifier 5 for effecting filtering-off and amplification of the high-frequency output signal produced by said network 4, a detector 6 for effecting detection of the amplified output signal, and a voltage fluctuation detecting circuit 7 for detecting the approach of the object by detecting the state of lowering of the detected voltage signal and feeding an alarm command to a driver 8 of an alarm 9.

In the construction as explained above, when a high-frequency signal having a fixed frequency Fo is fed from the oscillator 3 to the network 4, a high-frequency output voltage signal which has been attenuated in proportion to the degree of approach of the object to the sensor 1 is fed to the band-pass filter and amplifier 5, where the noise induced into the sensor 1 and the like is filtered off and oly the high-frequency component having frequency Fo is amplified. The frequency signal which has been amplified to a predetermined level is subjected to detection of the detector 6 and the D.C. voltage signal corresponding to the amplitude of said input frequency signal is fed to the voltage fluctuation dtecting circuit 7. This voltage fluctuation detecting circuit 7 serves to detect the state of lowering of the D.C. voltage signal applied thereto and apply an alarm command to the driver 8. Thus, the alarm 9 produces an alarm signal, such as warning sound or warning light.

Figure 3:
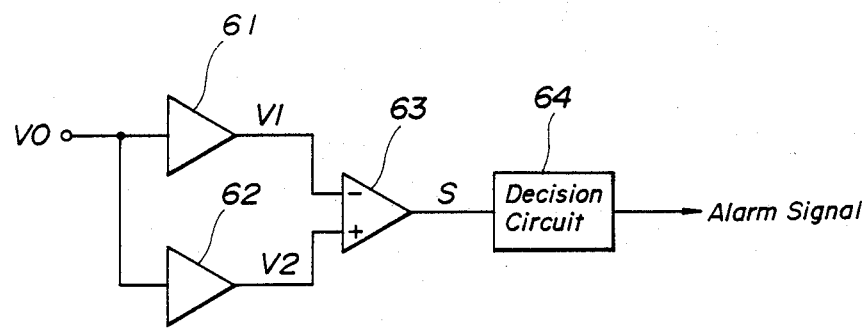
FIG. 3 is a block diagram showing an example of the construction of the voltage fluctuation detecting circuit shown in FIG. 2.

FIG. 3 illustrates an example of construction of the voltage fluctuation detecting circuit 7. This circuit includes a first amplifier 61 for amplifying the output voltage Vo of the detector 6, a second amplifier 62 for amplifying the same output voltage Vo with a predetermined delay, a comparator 63 for comparing the amplified output voltages V1 and V2, and a decision circuit 64 for giving a decision on whether the time width of the comparator output signal S is wider than a predetermined width or not. The amplifiers 61 and 62 have a same gain. The comparator 63 is applied with an offset voltage which is so adjusted that it produces a low level output when $V1 \geq V2$ and a high level output when $V1 < V2$.

Figure 4:
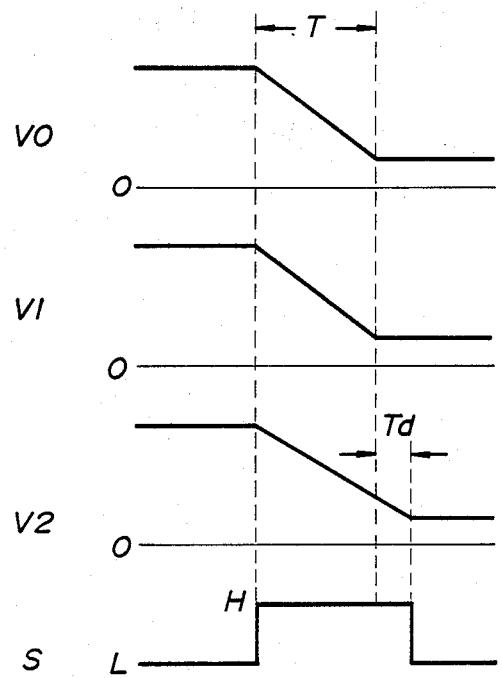
FIG. 4 is a time chart showing the signals in the voltage fluctuation detecting circuit, shown in FIG. 3.

In the construction as described above, when the input voltage Vo is lowered during the period T the output voltage V1 of the amplifier 61 is also lowered during the same period, as shown in FIG. 4. The output voltage V2 of the amplifier 62 is lowered, with a fixed delay time Td, with the result that V1<V2 during the period T+Td and consequently the output S of the comparator 63 has a high level. The period of lowering of the input voltage Vo varies, depending on the degree of approach of the object 2 to said sensor 1, and consequently the decision circuit 64 gives an alarm command when the time width of the output S of the comparator becomes wider than a predetermined value. In this regard it is to be noted that V1=V2 when the input voltage Vo has become fixed, without variation of the position of the object 2 relative to the sensor 1, while V1>V2 when the object 2 moves away from the sensor 1, and in each of these cases the output of the comparator 63 becomes of low level, so that no alarm command is produced thereby.

Figure 5:
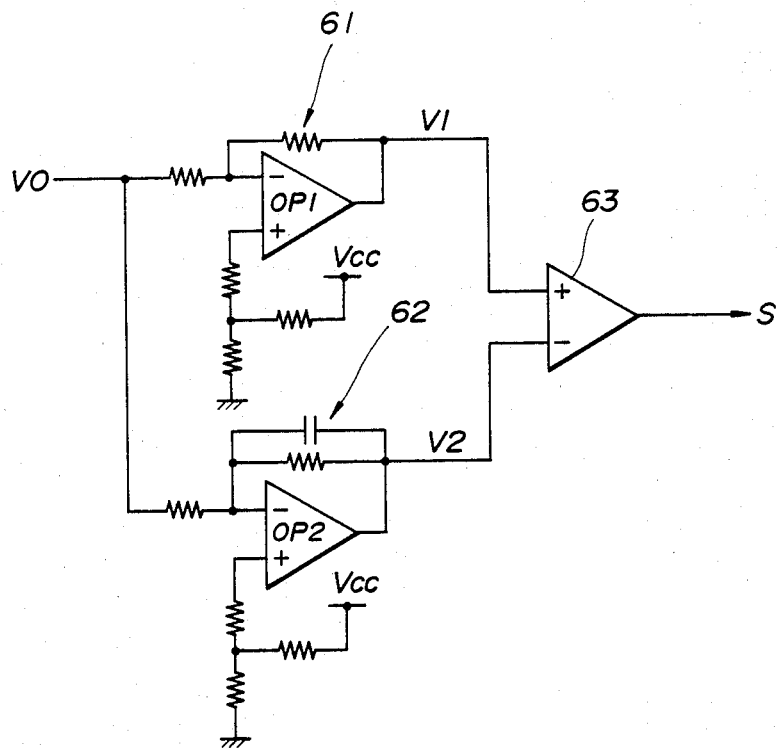
FIG. 5 is a circuit diagram showing an example of the detailed construction of the voltage fluctuation detecting circuit.

FIG. 5 illustrates an example of the detailed construction in which the each portion of the amplifiers 61 and 62 consists of an operational amplifier. The operational amplifier OP2 includes a delay element Cd connected in parallel with a feedback resistor. In this circuit construction, an offset voltage of the voltage comparator 63 is omitted by properly selecting the offset voltages of the respective operational amplifiers OP1 and OP2.

The device for detecting an object according to the present invention has a simple construction, as a whole, so that it provides little trouble. It has no insensible area at close range, as in the conventional device, and provides better detecting state as the object approaches to the device. It can detect the approaching object only and produce an optimum alarm, Accordingly it is advantageous to detect an object when an automobile is moving backward, for example.

I claim:

1. A device for detecting an object, comprising:
   a first means for converting a variation of a floating capacity between a sensor consisting of an electrode plate and an object to be detected into a variation of a frequency signal;
   a second means for converting said frequency signal into a voltage signal;
   a third means including first and second amplifiers arranged so that said voltage signal is supplied to both first and second amplifiers which then produce a first amplified signal and a second amplified signal with a delay, respectively; and
   a fourth means for comparing said first and second amplified signals and detecting the state of approach of the object in accordance with the attenuation of said voltage signal.

2. A device for detecting an object according to claim 1 in which said device includes:
   an oscillator for generating a signal having a fixed frequency;
   two serially connected networks arranged at the output side of said oscillator;
   a bank-pass filter and amplifier for effecting filtering-off of noise and amplification of the frequency signals fed from said networks;
   a detector for detecting the amplified frequency signal; and
   a voltage fluctuation detection circuit for detecting state of approach of the object in accordance with the attenuation of the voltage signal from said detector.

3. A device for detecting an object according to claim 2 in which said voltage fluctuation detection circuit includes:
   a first amplifier for amplifying an input voltage signal;
   a second amplifier having the same gain as that of the first amplifier for amplifying the input voltage signal with a fixed delay time;
   a voltage comparator for comparing the respective amplified output voltages to produce a high level output at the time of lowering of the input voltage signal; and
   a decision circuit for giving a decision on whether the time width of the high level output of the voltage comparator is wider than a predetermined width or not, thereby detecting the state of approach of the object to said sensor.

4. A method for detecting an object comprising the steps of:
   converting a variation of a floating capacity between a sensor consisting of an electrode plate and an object to be detected into a variation of a frequency signal;
   converting said frequency signal into a voltage signal;
   supplying said voltage signal to a first amplifier and, after a delay, to a second amplifier which produces a first amplified signal and a second amplified signal with said delay, respectively; and
   comparing said first and second amplified signals to detect the state of approach of the object in accordance with the attenuation of said voltage signal.

* * * * *

UNITED STATES PATENT AND TRADEMARK OFFICE
CERTIFICATE OF CORRECTION

PATENT NO. : 4,891,627

DATED : January 2, 1990

INVENTOR(S) : Eiji Murao

It is certified that error appears in the above-identified patent and that said Letters Patent is hereby corrected as shown below:

Col. 4, claim 2, line 11, change "A bank-pass filter" to
--a band-pass filter--.

Signed and Sealed this

Ninth Day of April, 1991

*Attest:*

HARRY F. MANBECK, JR.

*Attesting Officer*  Commissioner of Patents and Trademarks